(12) United States Patent
Tamlyn et al.

(10) Patent No.: US 7,203,127 B1
(45) Date of Patent: Apr. 10, 2007

(54) APPARATUS AND METHOD FOR DYNAMICALLY CONTROLLING DATA TRANSFER IN MEMORY DEVICE

(75) Inventors: Robert Tamlyn, Apex, NC (US); Joshua Osborne, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/241,601

(22) Filed: Sep. 29, 2005

(51) Int. Cl.
*G11C 8/00* (2006.01)

(52) U.S. Cl. ............. 365/233; 365/189.07; 365/189.05

(58) Field of Classification Search ................ 365/233, 365/189.07, 189.05, 207, 191, 201, 230.06
See application file for complete search history.

(56) References Cited

U.S. PATENT DOCUMENTS 5,668,766 A * 9/1997 Bramnik ...................... 365/207
7,072,234 B1 * 7/2006 Nierle .......................... 365/203

* cited by examiner

*Primary Examiner*—Tuan T. Nguyen
*Assistant Examiner*—Dang Nguyen
(74) *Attorney, Agent, or Firm*—Patterson & Sheridan, L.L.P.

(57) ABSTRACT

Methods and apparatus for operating a secondary sense amplifier according to different timings. Embodiments of the invention generally provide a secondary sense amplifier configured to dynamically adjust its timing according to a need for data in an output buffer. In one embodiment, the secondary sense amplifier is set (causing data to be driven out) by a signal, SSA_SET, the timing of which is adjusted on the basis of a predefined delay and a need for data at the output buffer.

26 Claims, 10 Drawing Sheets

APPARATUS AND METHOD FOR DYNAMICALLY CONTROLLING DATA TRANSFER IN MEMORY DEVICE

BACKGROUND OF THE INVENTION

1. Field of the Invention

The invention generally relates to memory devices and more particularly relates to dynamically controlling the transfer of data being read from a memory device.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices.

Some types of DRAM devices have a synchronous interface, generally meaning that data is written to and read from the devices in conjunction with a clock pulse. Early synchronous DRAM (SDRAM) devices transferred a single bit of data per clock cycle (e.g., on a rising edge) and are appropriately referred to as single data rate (SDR) SDRAM devices. Later developed double-data rate (DDR) SDRAM devices included input/output (I/O) buffers that transfer a bit of data on both rising and falling edges of the clock signal, thereby doubling the effective data transfer rate. Still other types of SDRAM devices, referred to as DDR-II SDRAM devices, transfer two bits of data on each clock edge, typically by operating the I/O buffers at twice the frequency of the clock signal, again doubling the data transfer rate (to 4× the SDR data transfer rate).

Data read out from such DDR devices is often held in first-in first-out (FIFO) structures that receive the data from the memory arrays and drive the data out onto external data lines. Input and output pointers are typically used to determine (or "point to") a FIFO location to which data is to be input to or output from the FIFO, respectively. These pointers are typically derived from a signal that is essentially generated as a prediction of when the data should be valid at the FIFO, based on predicted delay through components in the data path. The output pointers ensure the synchronous requirements of data output from the DRAM are satisfied.

Transmitting the data from the memory arrays to the FIFO typically involves primary sense amplifiers and a secondary sense amplifier. Specifically, data read out from the memory arrays is driven onto sense lines by the primary sense amplifiers. Secondary sense amplifiers amplify the data from the sense lines and drive the data to the FIFO.

Driving the data from the secondary sense amplifier to the FIFO is done on the basis of a predefined delay in order to ensure the data signal is sufficiently developed. Typically, this predefined delay is set to ensure that the slowest device performance is accommodated, with some additional margin. However, determining this predefined delay is difficult since many factors can affect the performance of a given chip. For example, the manufacturing process itself produces transistors of varying strengths. In operation, the voltage levels and the temperature affect performance. Accordingly, the predefined delay must accommodate these and other factors and variables. At the same time, in order to achieve the fastest performance possible, it is undesirable to set the predefined delay any later than necessary. Accordingly, establishing the secondary sense amplifier delay is a balancing of yield (i.e., the measure of the number of chips that satisfy certain predefined performance criteria) and performance. The greater the yield (attained by setting a relatively more relaxed secondary sense amplifier timing) the lesser the performance, and vice versa.

Because of the difficulty in determining the optimal delay before setting the secondary sense amplifier, and the necessary loss of some performance to accommodate margins, the conventional approach of using a fixed delay is undesirable. Therefore, what is needed is an apparatus and method for dynamically setting the secondary sense amplifiers.

SUMMARY OF THE INVENTION

Embodiments of the invention generally provide methods and apparatus for operating a secondary sense amplifier according to different timings.

One embodiment provides a method for driving data to an output circuit of a memory device, including for data read from a memory array of the memory device: (i) operating a secondary sense amplifier at a first timing to drive the data to the output circuit; and (ii) upon detecting a predefined condition, operating the secondary sense amplifier at a second timing to drive the data to the output circuit, the second timing being faster than the first timing relative to the occurrence of a predefined signal.

Another embodiment provides a method for driving data to an output circuit of a memory device, including operating a secondary sense amplifier at a first timing to drive data to the output circuit, the secondary sense amplifier being coupled to a primary sense amplifier configured to drive the data from a memory array to the secondary sense amplifier; and determining whether data to be clocked out of the output circuit at a predetermined time will be present in the output circuit at the predetermined time. If the data will not be present at the predetermined time, the secondary sense amplifier is operated at a second timing, faster than the first timing, to cause the data to be driven to the output circuit in sufficient time for the data to be clocked out of the output circuit at the predetermined time.

Yet another embodiment provides a memory device having one or more memory arrays, external data pads and for each external data pad, a first-in first-out (FIFO) structure having an input stage configured to transfer a plurality of bits of data in parallel from the memory arrays to a storage location identified by an input pointer having a corresponding input pointer signal and an output stage configured to transfer bits of data sequentially from a storage location identified by an output pointer having a corresponding output pointer signal, wherein the input pointer and the output pointer are shifted periodically from one data storage location to another by adjusting the respective pointer signals. The memory device further includes a secondary sense amplifier configured to drive data to the FIFO structure, the data driven from the secondary sense amplifier then being latched into the storage location being pointed to by the input pointer; wherein the secondary sense amplifier can be set to drive data on the basis of at least two different timings.

Yet another embodiment provides a memory device having one or more memory arrays, external data pads and, for each external data pad, a first-in first-out (FIFO) structure having a plurality of entries for storing data from the one or more memory arrays. The memory device further includes pointer generation logic configured to generate: (i) an input pointer signal defining an input pointer to identify a particular entry in the FIFO structure in which to store data from the one or more memory arrays; and (ii) an output pointer signal defining an output pointer to identify a particular entry in the FIFO structure from which to shift data out of; wherein the pointer generation logic is configured to shift the input pointer and the output pointer periodically from one entry to another by adjusting the respective pointer signals. The memory device further includes a data request signal generator configured to assert a data request signal upon detecting the input pointer and output pointer are pointing to the same entry of the FIFO structure; and a secondary sense amplifier configured to drive data to the FIFO structure, the data driven from the secondary sense amplifier then being latched into the storage location being pointed to by the input pointer; wherein the secondary sense amplifier can be set to drive data on the basis of at least a first timing that is dependent on the data request signal and a second timing that is independent of the data request signal.

Still another embodiment provides a memory device having one or more memory arrays; a first-in first-out (FIFO) structure having a plurality of entries for storing data from the one or more memory arrays; location identification logic configured to identify entries in the FIFO for shifting data into and out of; a data request signal generator configured to assert a data request signal upon detecting that the location identification logic is simultaneously identifying the same entry for data to be input into and output from; and a secondary sense amplifier configured to drive data to the FIFO structure, the data driven from the secondary sense amplifier then being latched into an entry identified by the location identification logic; wherein the secondary sense amplifier can be set to drive data on the basis of at least a first timing that is dependent on the data request signal and a second timing that is independent of the data request signal.

Still another embodiment provides a memory device having data storage means; buffer means having a plurality of entries for storing data from the data storage means; location identification means configured to identify entries in the buffer means for shifting data into and out of; data request means for asserting a data request signal upon detecting that the location identification means is simultaneously identifying the same entry for data to be input into and output from; and amplification means configured to drive data to the buffer means, the data driven from the amplification means then being latched into an entry identified by the location identification means; wherein the amplification means can be set to drive data on the basis of at least a first timing that is dependent on the data request signal and a second timing that is independent of the data request signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Introduction

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments of the invention generally provide a secondary sense amplifier configured to dynamically adjust its timing. In one embodiment, the secondary sense amplifier is set (causing data to be driven out) by a signal, SSA_SET, the timing of which is adjusted on the basis of a predefined delay and a need for data at an output buffer.

An Exemplary Memory Device with a Dual Frequency FIFO

Figure 1:
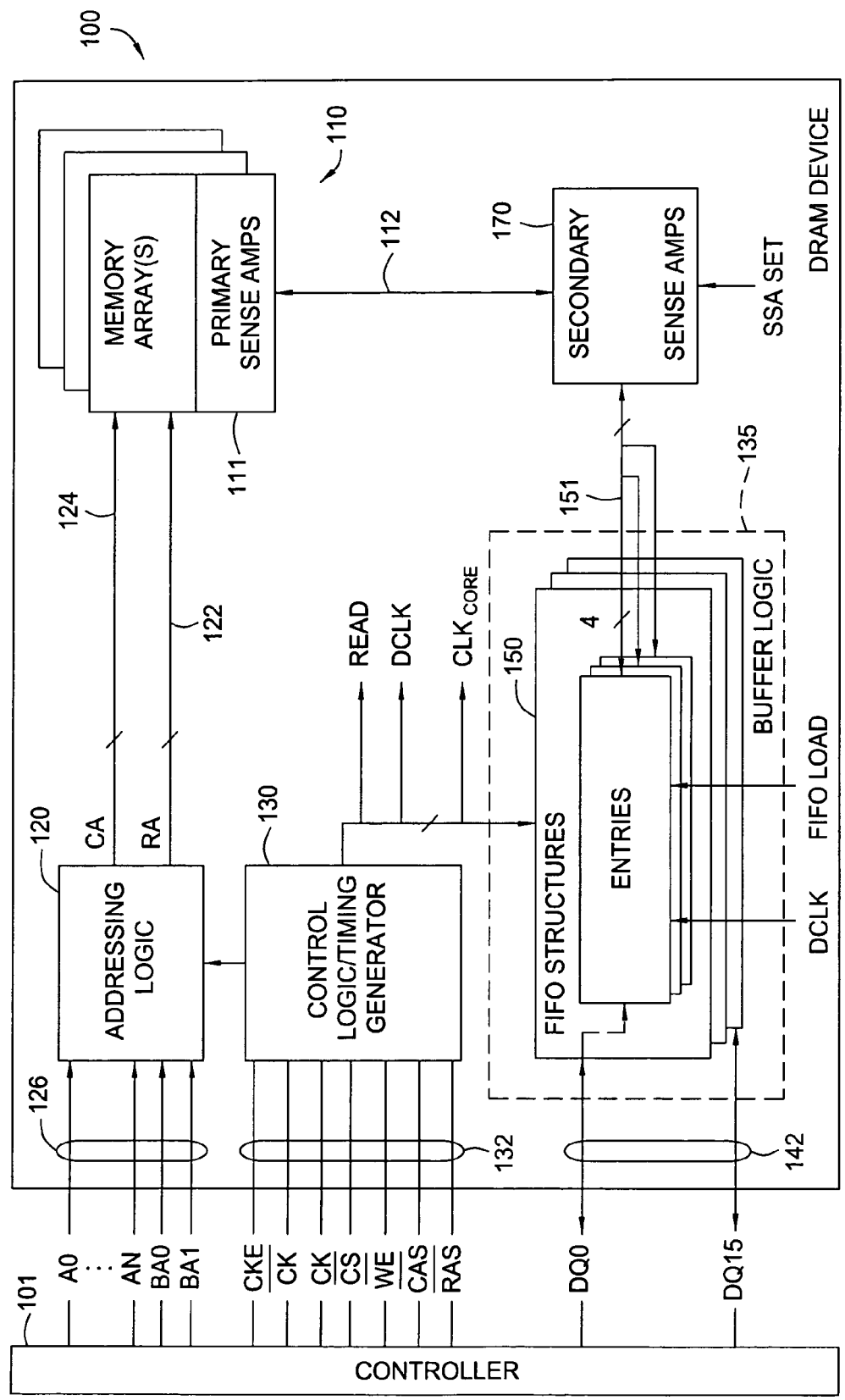
FIG. 1 is a block diagram of a memory device, according to one embodiment of the invention.

FIG. 1 illustrates an exemplary memory device 100 (e.g., a DRAM device) having an output circuit in accordance with one embodiment of the present invention. In particular, the output circuit is used to access data stored in one or more memory arrays 110 (or banks, commonly referred to collectively as the memory core). In the illustrative embodiment of FIG. 1, the output circuit includes I/O buffering logic 135 and FIFO structures 150. However, the output circuit of FIG. 1 is merely illustrative and persons skilled in the art will recognize other embodiments within the scope of the invention.

As illustrated, the device 100 may include control logic 130 to receive a set of control signals 132 from a controller 101. The signals cause data to be accessed (e.g., read, write, or refresh) in the arrays 110 at locations specified by a set of address signals 126. The address signals 126 may be latched in response to signals 132 and converted into row address signals (RA) 122 and column address signals (CA) 124 used to access individual cells in the arrays 110 by addressing logic 120.

Data presented as data signals (DQ0–DQ15) 142 read from and written to the arrays 110 may be transferred between external data pads (not shown) and the arrays 110 via primary sense amplifiers 111, secondary sense amplifiers 170 and I/O buffering logic 135. Illustratively, each one of the memory arrays 110 includes a bank of primary sense amplifiers 111 coupled to the secondary sense amplifiers 170 (also referred to in the singular as "the secondary sense amplifier 170"). In one embodiment, a secondary sense amplifier may be provided for each bit line coupling the primary sense amplifiers 111 to the arrays 110.

In the case of a read operation, for example, an appropriate combination of signals is issued from the controller 101 causing the control logic 130 to issue a READ command. The primary sense amplifiers 111 operate to drive the data accessed in the individual cells onto sense lines 112. The secondary sense amplifiers 170 then amplify and drive the data present on the sense lines 112 to the I/O buffering logic 135. In one embodiment, the secondary sense amplifier 170 is set (causing the data on the sense lines 112 to be latched into the I/O buffering logic 135) by a SSA_SET signal, which will be described in more detail below. However, it should be noted that, in general, the SSA_SET signal is any signal that initiates data being driven to the data buffer circuitry, such as I/O buffering logic 135. Accordingly, the secondary sense amplifier 170 includes any circuitry disposed between primary sense amplifiers and an output circuit (e.g., I/O buffering logic 135) such as one or more sense amplifiers and/or preamplifiers coupled to the sense lines 112.

Illustratively, data is driven from the secondary sense amplifiers 170 to the I/O buffering logic 135 via a bus of data lines 151. Assuming a total of 16 external data pads DQ<15:0>, there may be 64 total data lines 151 for a DDR-II device (32 for a DDR-I device and 128 for DDR-III). However, embodiments of the present invention are not limited to a particular number of external data pads and data lines, and particular implementations may vary.

In the illustrated embodiment, the number of data lines 151 is greater than the number of data signals 142 and corresponding external data pads. Accordingly, bits received in parallel on the data lines 151 are serialized for output on the external data pads. As an example, assuming the "x16" device illustrated, 64 bits of data may be retrieved from the arrays 110, in each read access, and loaded as 4-bits, in parallel, to entries (e.g., latch elements) of the FIFO structures 150 for each external data pad. The 64 bits of buffered data may then be output from the FIFO structures 150 as 16 bits (one for each data pad) on each edge of consecutive data clock signals. For "x4" or "x8" devices, data may be output in a similar manner, as 4 or 8 bits, respectively, on each edge of consecutive data clock signals.

Figure 2:
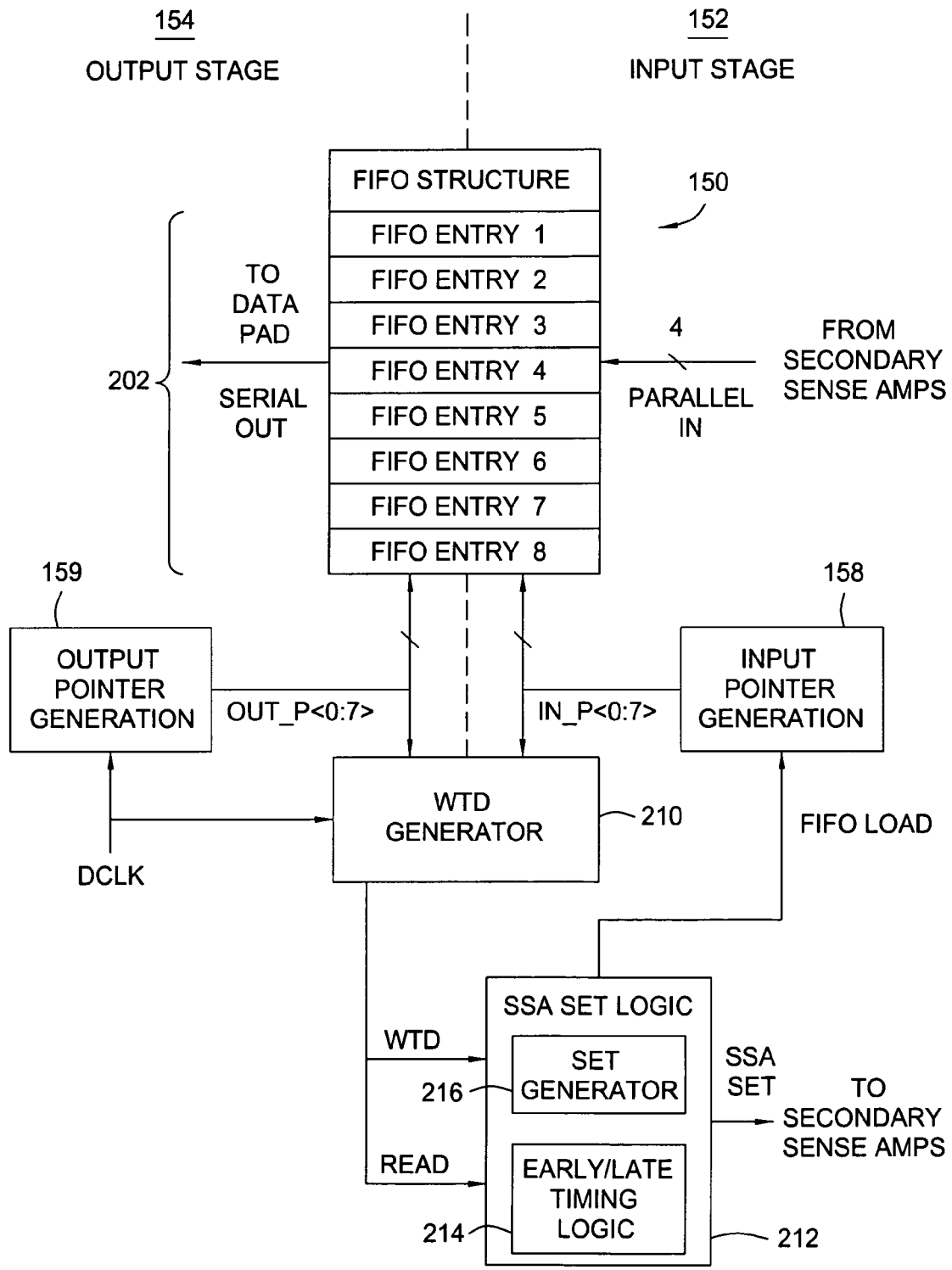
FIG. 2 is a block diagram of an output circuit and corresponding circuitry for requesting data from a secondary sense amplifier, according to one embodiment of the invention.

In general, data is latched into the FIFO structures 150 and clocked out of the FIFO structures 150 according to a FIFO_LOAD signal and DCLK signal, respectively. More particularly, the FIFO_LOAD signal and DCLK signals are used to generate pointers which determine the FIFO locations where data is to be input and output, as will now be described with reference to FIG. 2. FIG. 2 shows a given FIFO structure 150, in which 4 bits of data are received (at an input stage 152) in parallel from the secondary sense amplifier 170 and output (from an output stage 154) serially to a particular external pad. The FIFO structure $150_1$ includes a number of entries 202 for storing the incoming bits. Illustratively, the FIFO structure $150_1$ is eight entries deep (i.e., the FIFO structure $150_1$ includes eight entries 202), with each entry being configured to hold 4 bits. As illustrated, the input stage 152 of the FIFO structure 150, may include input pointer generation circuit 158 driven by the FIFO_LOAD signal. The input pointer generation circuit 158 may produce an input pointer signal, illustrated as an 8-bit signal IP<0:7>, that selects ("points to") one of the entries 202 of the FIFO structure $150_1$ in which data read from memory arrays can be input and held prior to output on external data pads. Similarly, the output stage 154 may include output pointer generation circuit 159 driven by the data clock signal, DCLK, to produce an output pointer signal, illustrated as an 8-bit signal OP<0:7>, that points to a single latch element 156 from which data may be output to an external data pad. In such an embodiment, a unique pointer signal is available for each of the eight entries 202 in the FIFO structure $150_1$. However, alternative embodiments are contemplated. For example, instead of using actual pointers the entries may be identified according to respective addresses. Thus, for an 8-deep FIFO structure, a 3-bit pointer address may be used to identify each entry in a given FIFO structure. For purposes of simplicity, embodiments of the present invention will be described with respect to a pointer-based implementation.

So long as the input pointer "leads" the output pointer, data will be available for output in the location being pointed to by the output pointer. For example, with reference to the FIFO structure $150_1$ of FIG. 2, consider that the I/O pointers move sequentially from one entry to the next. Then, if the input pointer is pointing to Entry 4 (indicating data is about to be written to Entry 4), while the output pointer is pointing to Entry 3 (indicating data is about to be output from Entry 3), the data will be available timely in Entry 3.

However, under certain circumstances during a burst read, the input pointer and the output pointer may point to the same location. This condition may occur in systems with external clock speeds are sufficiently higher than the internal speed of the memory device 100. When this condition occurs, the data will not be available on the external pads when expected (i.e., a predetermined number of cycles from the READ command, referred to as CAS latency), resulting in an error. To address this condition, embodiments of the present invention provide a secondary sense amplifier 170 that is dynamically adjusted by adjusting the SSA_SET signal. FIG. 2 shows a particular embodiment in which the SSA_SET signal is output on the basis of the input and output pointers. Illustratively, the input and output pointers are input to a WTD generator 210. The WTD generator 210 also takes as input the DCLK signal and selectively outputs a WTD ("Where is the Data") signal. The WTD and the READ command are input to SSA_Set logic 212 which is configured with Early/Late timing logic 214 and a Set generator 216, and operates to issue the SSA_SET signal to the secondary sense amplifiers 170.

Figure 3:
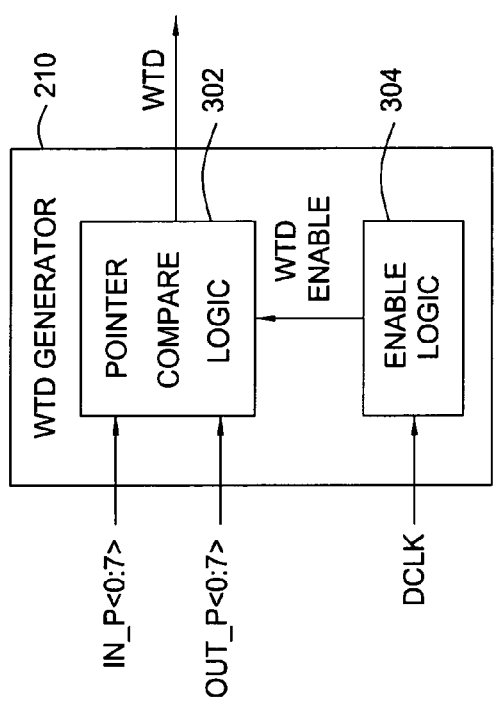
FIG. 3 is a block diagram of a data request signal generator, according to one embodiment of the invention.

Referring now to FIG. 3, an embodiment of the WTD generator 210 is shown. Illustratively, WTD generator 210 includes pointer compare logic 302. The pointer compare logic 302 takes as input an input pointer signal (IN_P) and an output pointer signal (OUT_P) corresponding to the FIFO entries being pointed to by the respective signals. The pointer compare logic 302 is configured to evaluate the two pointer signals and determine whether the signals are pointing to the same FIFO entry (indicating all available data has been clocked out from the FIFO structures 150). If the same FIFO entry is being pointed to, then the pointer compare logic 302 issues the WTD signal. In one embodiment, prior to the pointer compare logic 302 issuing the WTD signal, the pointer compare logic 302 must first be enabled by a WTD_Enable signal issued by enable logic 304. The enable logic 304 is configured to issue the WTD_Enable signal on the basis of the DCLK signal. In one embodiment, the enable logic 304 may be configured such that the WTD_Enable signal is not asserted until a preamble period of the DCLK signal, typically indicated by DCLK going low for a predetermined period of time. Prior to the DCLK going low in response to a read command, the DLCK signal is in a tri-state mode. In this mode the input point and output pointer will be pointing to the same FIFO entry, since a burst read has not been initiated. In this state the pointer compare logic 302 would evaluate the pointers to be equal and assert the WTD signal. To avoid setting the secondary sense amplifier 170 in this state, the pointer compare logic 302 is disabled until the preamble of the DLCK signal. Only once the preamble of the DLCK signal is detected is the pointer compare logic 302 enabled, since at a next clock edge data is expected and, thus, the pointers must be evaluated to ensure the data will be timely available.

Figure 4:
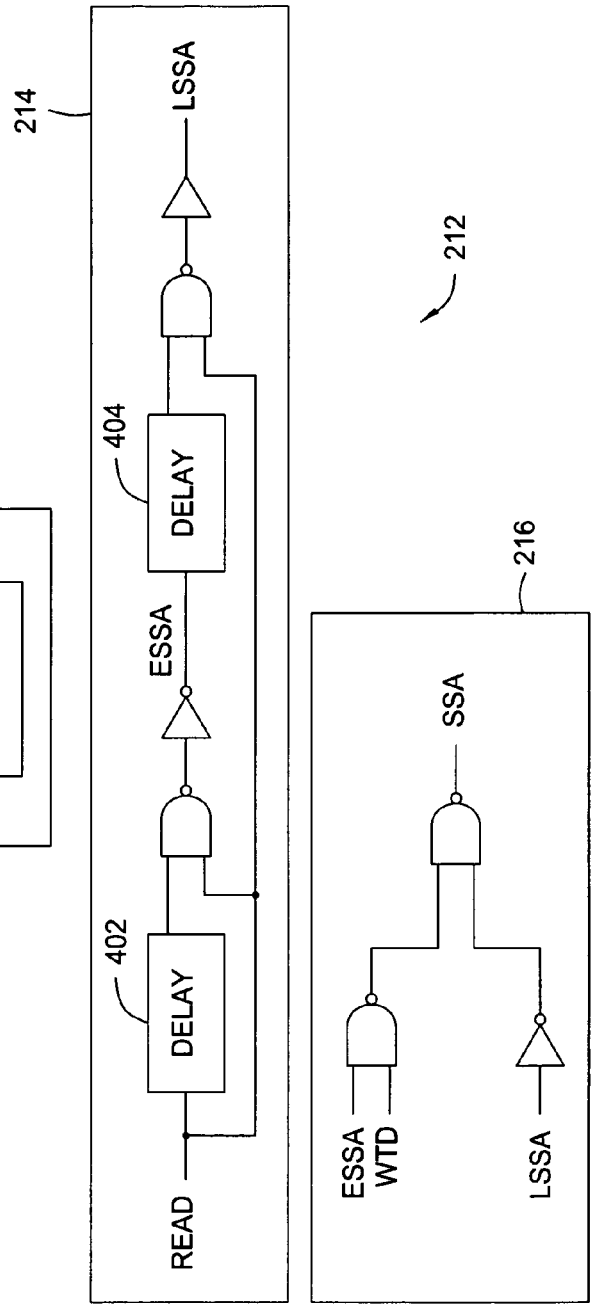
FIG. 4 is a schematic of timing signal logic and secondary sense set signal generation logic, according to one embodiment of the invention.

Referring now to FIG. 4, one embodiment of the SSA set logic 212 is shown. In general, the SSA set logic 212 is configured to assert the SSA_SET signal on the basis of the WTD signal and one or more timing boundaries. Illustratively, the timing logic 214 establishes the one or more timing boundaries. For example, one timing signal produced by the timing logic 214 is a late set timing signal, LSSA. Another timing signal which may be produced by the timing logic 214 is an early set timing signal, ESSA. In general, the Early/Late timing logic 214 is triggered by the READ command which is input to a first delay 402. The first delay 402 produces the ESSA signal which is input to a second delay 404, the output of which is the LSSA signal. Thus, the ESSA signal is output after a first predetermined period of time from the READ command and the LSSA signal is output after a second predetermined period of time from the READ command, where the second predetermined period of time is greater than the first predetermined period of time. It is contemplated that the first and second delays 402, 404 are trimmable to a desired delay.

The ESSA and LSSA signals are input to the Set generator 216. Where the ESSA signal and the WTD signals are being asserted and the LSSA signal is not being asserted, the Set generator 216 issues the SSA_SET signal to the secondary sense amplifiers 170. On the other hand, the Set generator 216 is also configured to assert the SSA_SET signal if the LSSA signal is asserted before both the ESSA signal and the WTD signals are asserted.

In the embodiment of FIG. 4 the SSA_SET signal is not asserted on the basis of the WTD signal alone; rather, a threshold amount of time from the READ command must first have elapsed (controlled by the ESSA). However, it is also contemplated that the secondary sense amplifiers 170 may be set upon assertion of the WTD signal without regard for additional timing limitations, i.e., without requiring that the ESSA signal be asserted. In such embodiments, the device may continue to operate at increasing speeds without a predetermined limit.

Exemplary Timing Diagrams

Figure 5:
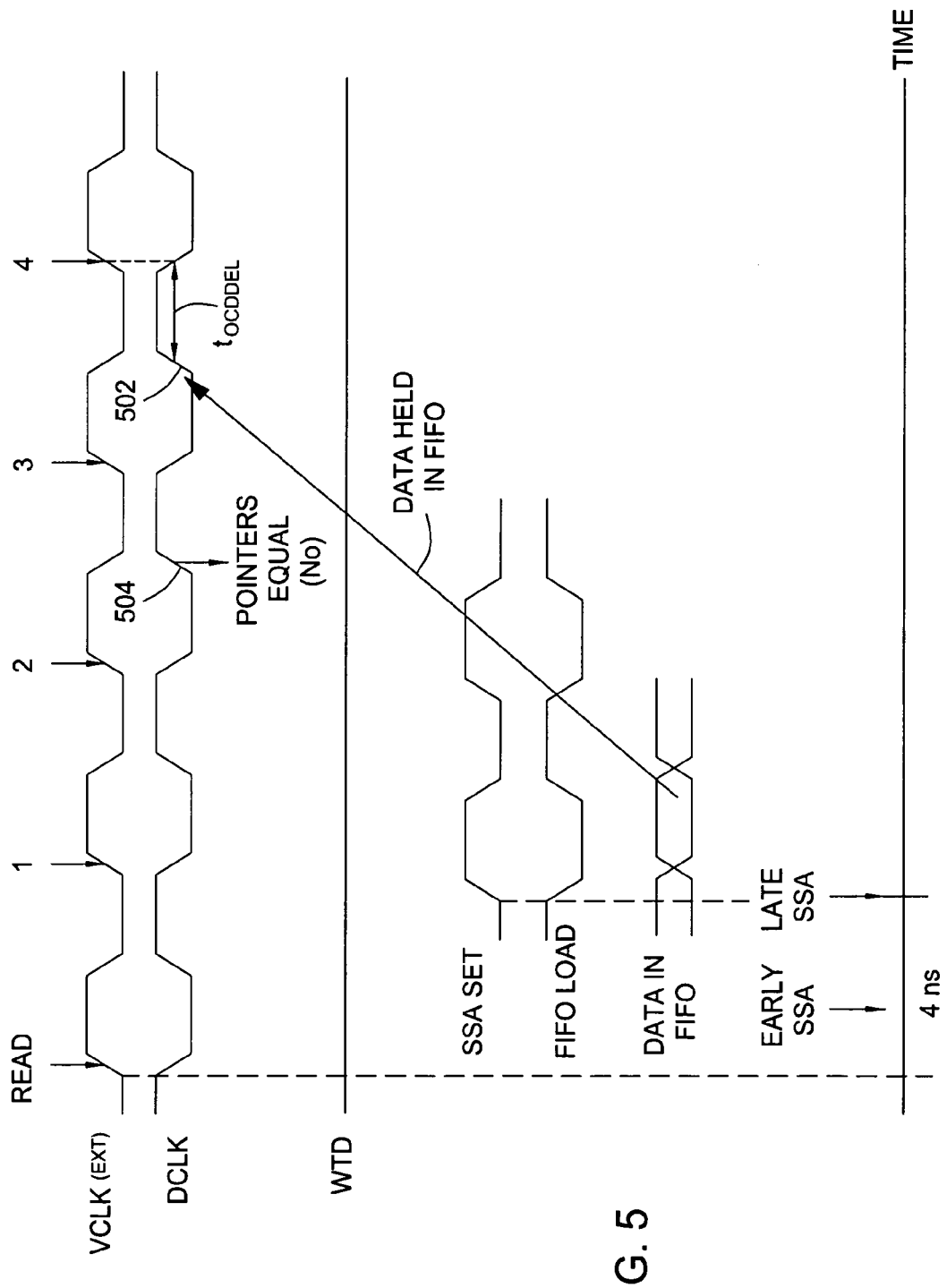
FIG. 5 is a timing diagram illustrating slow speed operation of a memory device, according to one embodiment of the invention.
Figure 6:
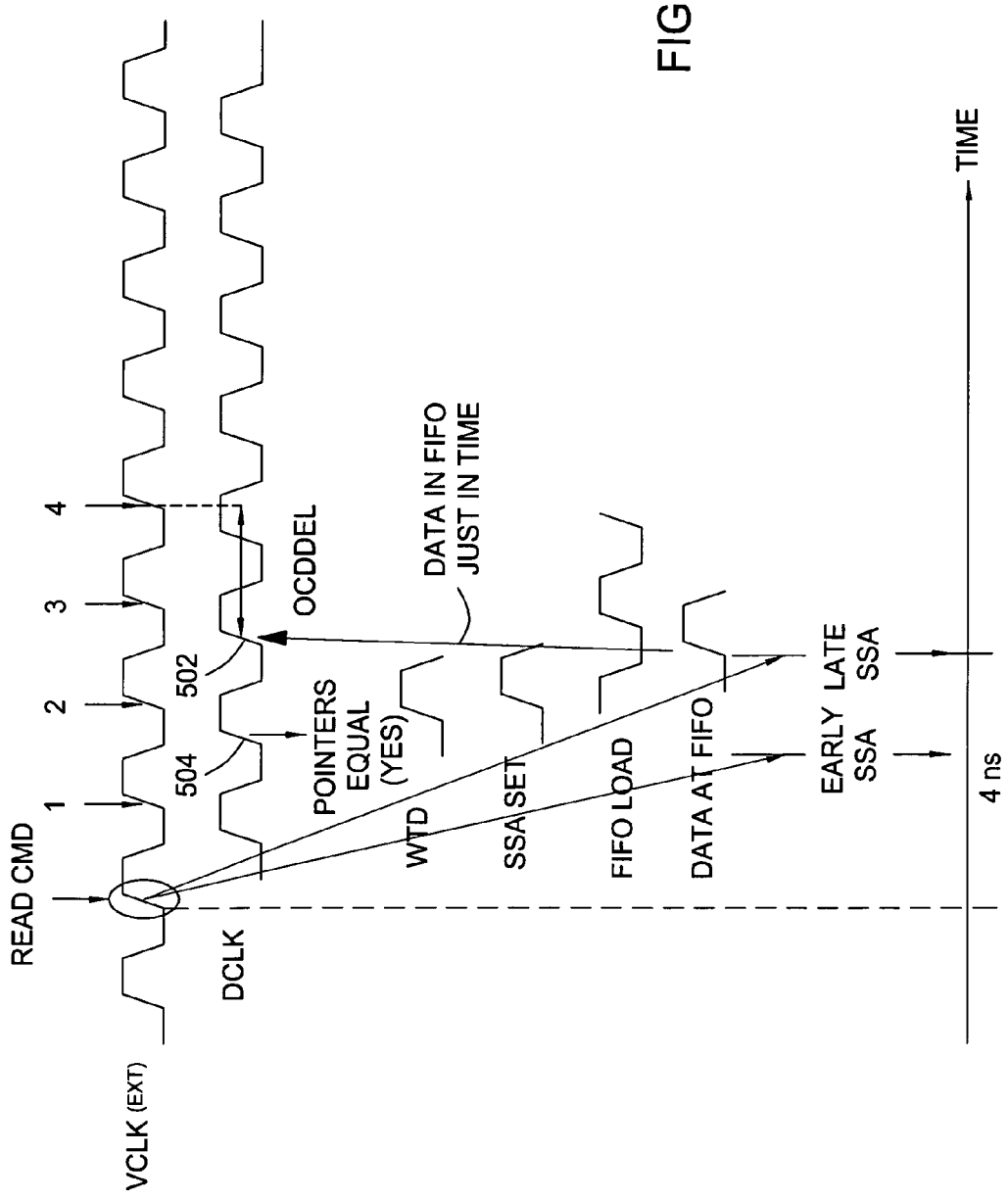
FIG. 6 is a timing diagram illustrating high speed operation of a memory device, according to one embodiment of the invention.

Illustrative timing diagrams are shown in FIGS. 5–6 for different operating speeds. FIG. 5 shows a relatively slow speed operation in which the secondary sense amplifier 170 may be set by the LSSA signal. In contrast, FIG. 6 shows a relatively higher speed operation.

Referring first to FIG. 5, a READ command is indicated on a rising edge of the external clock signal, VCLK. In the illustrative example, a CAS latency of four is assumed. That is, the memory controller 101 expects the data at the output on the fourth rising edge of the VCLK signal after the READ command. The CAS latency is represented by the down-pointing arrows and corresponding numbers at the four sequential rising edges of the VCLK signal. Data is shifted out of the FIFO structures 150 at rising edges of the DCLK signal which is aligned with the VCLK signal. Proper alignment of the DCLK signal with the VCLK signal is ensured by a latency counter, as is known in the art.

For the illustrative embodiment, FIG. 5 shows an off chip driver delay ($t_{OCDDEL}$) representative of the time required between shifting data from the FIFO structures 150 (at a rising edge 502) until the data is ready at the output. Thus, in order to ensure availability of the data, the data must be clocked out at the rising edge 502 prior to the beginning of the OCDDEL.

Therefore, in one embodiment, the input pointer and output pointer are evaluated one clock cycle prior to the DCLK edge 502 on which data is shifted out. Accordingly, as illustrated in FIG. 5, the pointer evaluation occurs at the DCLK edge 504.

In operation, the READ command initiates the creation of the late set timing signal, LSSA, and optionally the early set timing signal, ESSA. In general, the LSSA signal is a relaxed timing that accommodates slow performance and ensures high yield. In a particular embodiment, the LSSA signal is timed to set the secondary sense amplifier 170 as late as possible while still providing data to the DQ buffers (FIFO structures 150) for the required access time. In this way, the SSA_SET timing need not be set precisely. However, it is contemplated that, in other embodiments, the LSSA signal may be set faster than the latest possible timing.

In the illustrative embodiment, the LSSA is asserted 4 ns after the READ command, according to the length of time needed to process the READ command. Since the pointer evaluation has not yet occurred when the LSSA is asserted, WTD is necessarily low (not asserted). Accordingly, this condition (i.e., LSSA being asserted) causes the SSA_SET signal to go high, whereby data is latched into the FIFO structures as represented by the FIFO_LOAD signal. Consequently, data is held in the FIFO structures and is available to be clocked out at the appropriate rising edge 502 of the DCLK signal.

FIG. 5 also illustrates an embodiment in which the early set timing signal, ESSA, is generated. However, because WTD is low (not asserted) when the ESSA signal is asserted, the SSA_SET signal is not asserted. Thus, the ESSA signal has no impact where data is being clocked out of the memory device at a sufficiently slow speed, relative to the speed of operation of the memory device.

By way of comparison, FIG. 6 shows a timing diagram in which data is being clocked out at a relatively higher speed (as compared to FIG. 5) while internally the memory device operates at the same speed, with the exception of the SSA_SET timing. Accordingly, the relative timings of the timing signals, ESSA and LSSA, are the same with respect to the READ command regardless of the VCLK and DCLK speeds. However, where the data is being clocked out at a sufficiently high speed the input pointer and output pointer may point to the same location at various times. If this condition exists when the pointers are evaluated at the rising edge 504, then WTD is pulled high. Further, if sufficient time has passed so that ESSA is asserted (as shown in FIG. 6), then the SSA_SET signal is asserted causing data to be latched into the FIFO structures. As can be seen from FIG. 6, the data is available at the FIFO structure just in time to be shifted out with sufficient time to accommodate $t_{OCDDEL}$ (i.e., at the rising edge 502). In other embodiments (e.g., with relatively higher clock speeds), the rising edge at which the pointer are evaluated may occur earlier than one clock cycle prior to the rising edge 502.

Timing Examples

Figure 7:
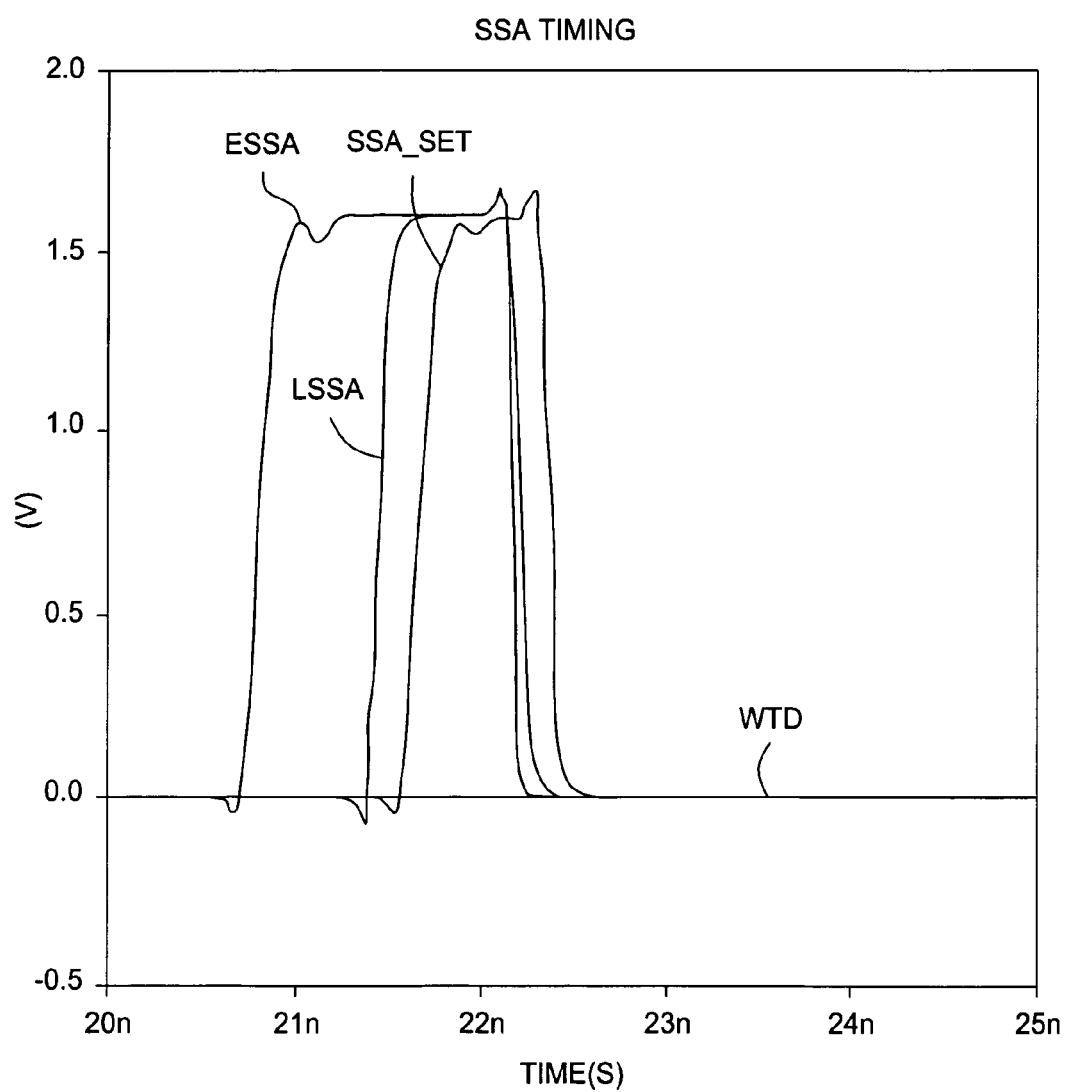
FIG. 7 is a signal timing example illustrating relative signal timings in a slow speed environment, according to one embodiment of the invention.
Figure 8:
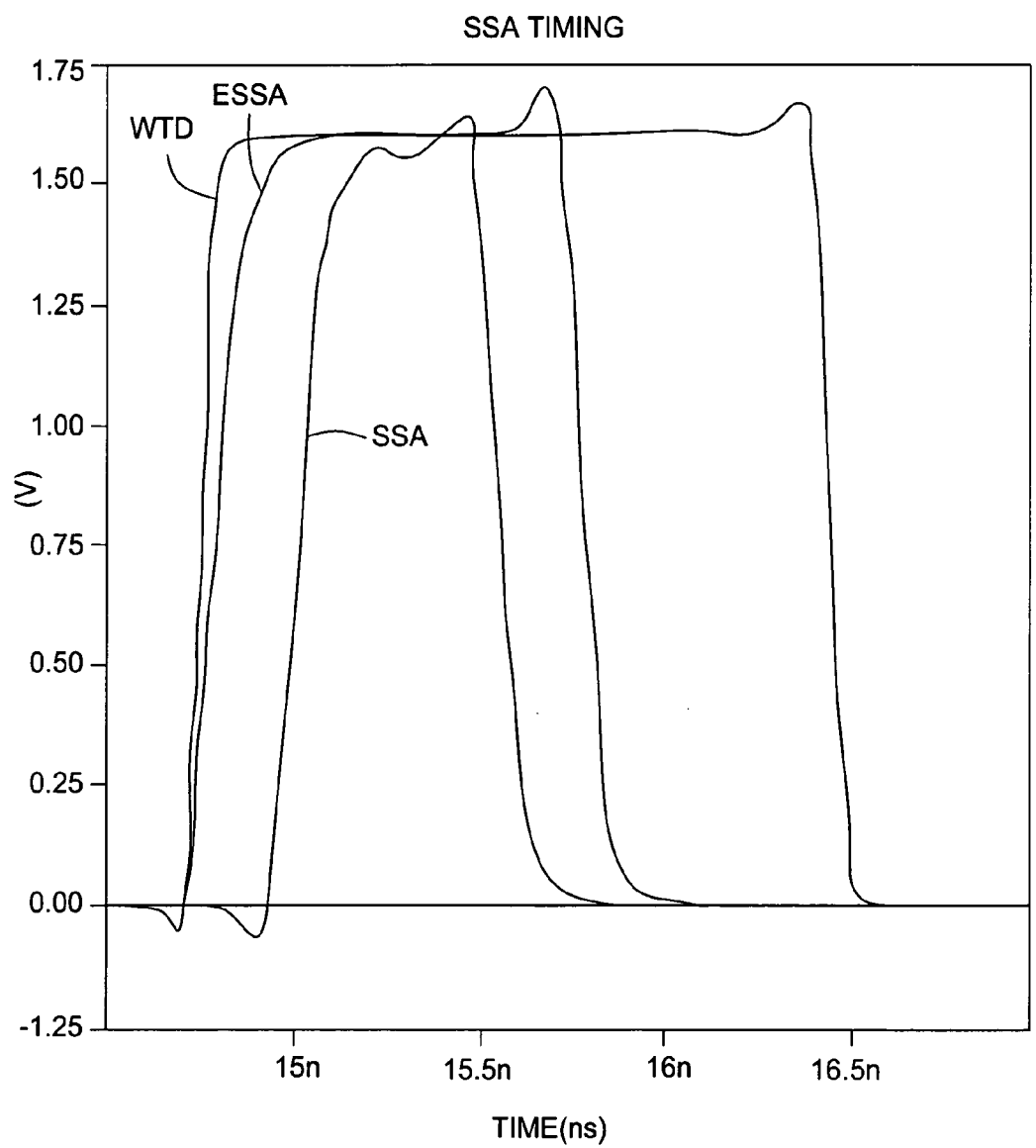
FIG. 8 is a signal timing example illustrating relative signal timings in a high speed environment, according to one embodiment of the invention.
Figure 9:
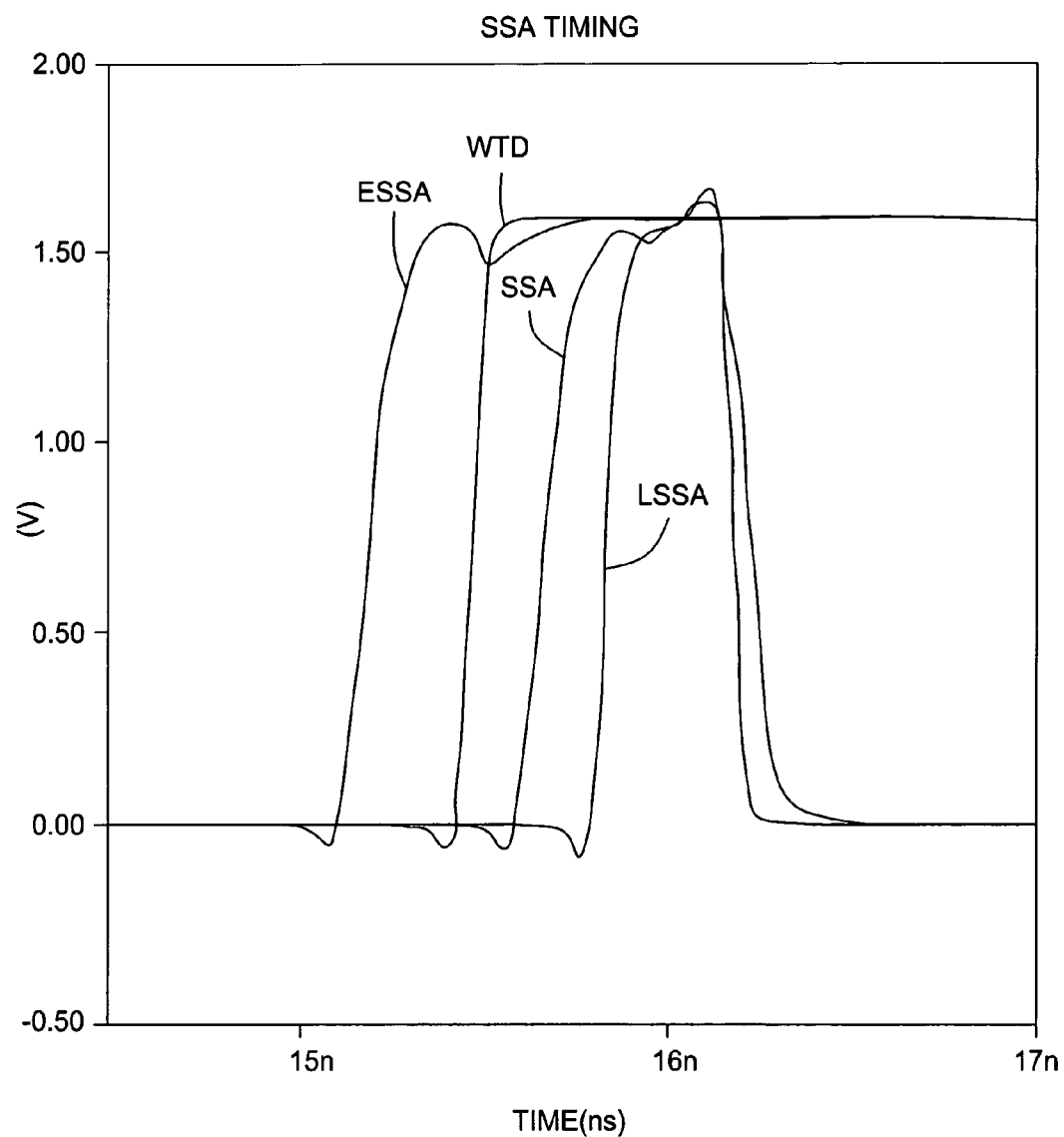
FIG. 9 is a signal timing example illustrating relative signal timings in a mid-speed environment, according to one embodiment of the invention.

Referring now to FIG. 7, a timing example of the relatively slow clock corresponding to FIG. 5 is illustrated. In particular, FIG. 7 illustrates that the WTD signal is not asserted at a sufficiently slow speed. Accordingly, the presence of the ESSA signal in the absence of the WTD signal has no affect on the SSA_SET signal. The later generated LSSA signal then causes the SSA_SET signal to be asserted. In contrast, FIG. 8 illustrates the situation (corresponding to the relatively high clock speed illustration of FIG. 6) in which the WTD signal and the ESSA signal arrive substantially contemporaneously and prior to the LSSA signal (which remains low in FIG. 8), thereby causing the SSA_SET signal to be asserted. FIG. 9 illustrates yet another situation in which the WTD signal arrives after the ESSA signal and before the LSSA signal, corresponding to a clock speed between the clock speeds of FIGS. 7 and 8.

Figure 10:
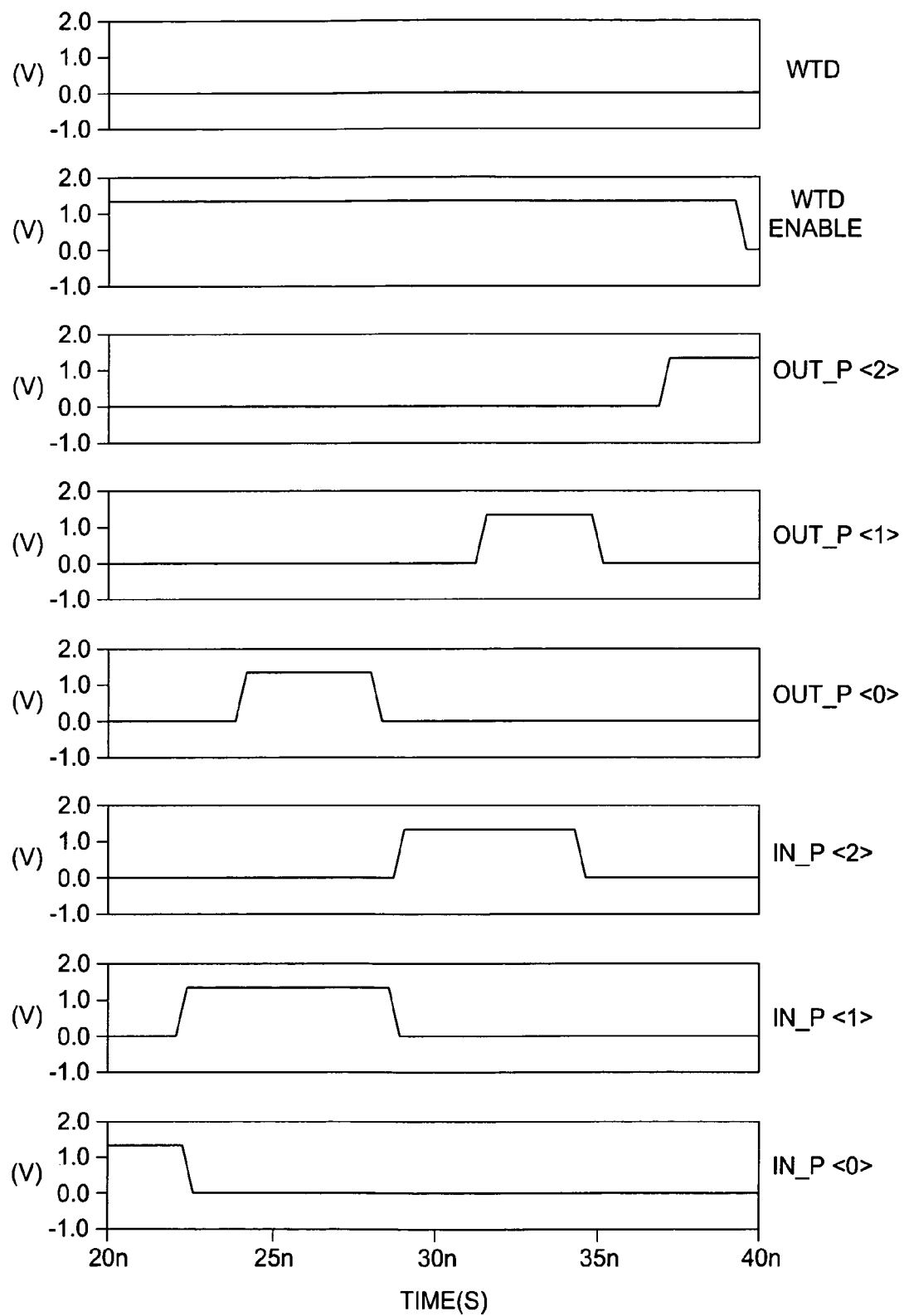
FIG. 10 is a pointer timing example illustrating pointer signals during a slow speed operation of a memory device, according to one embodiment of the invention.
Figure 11:
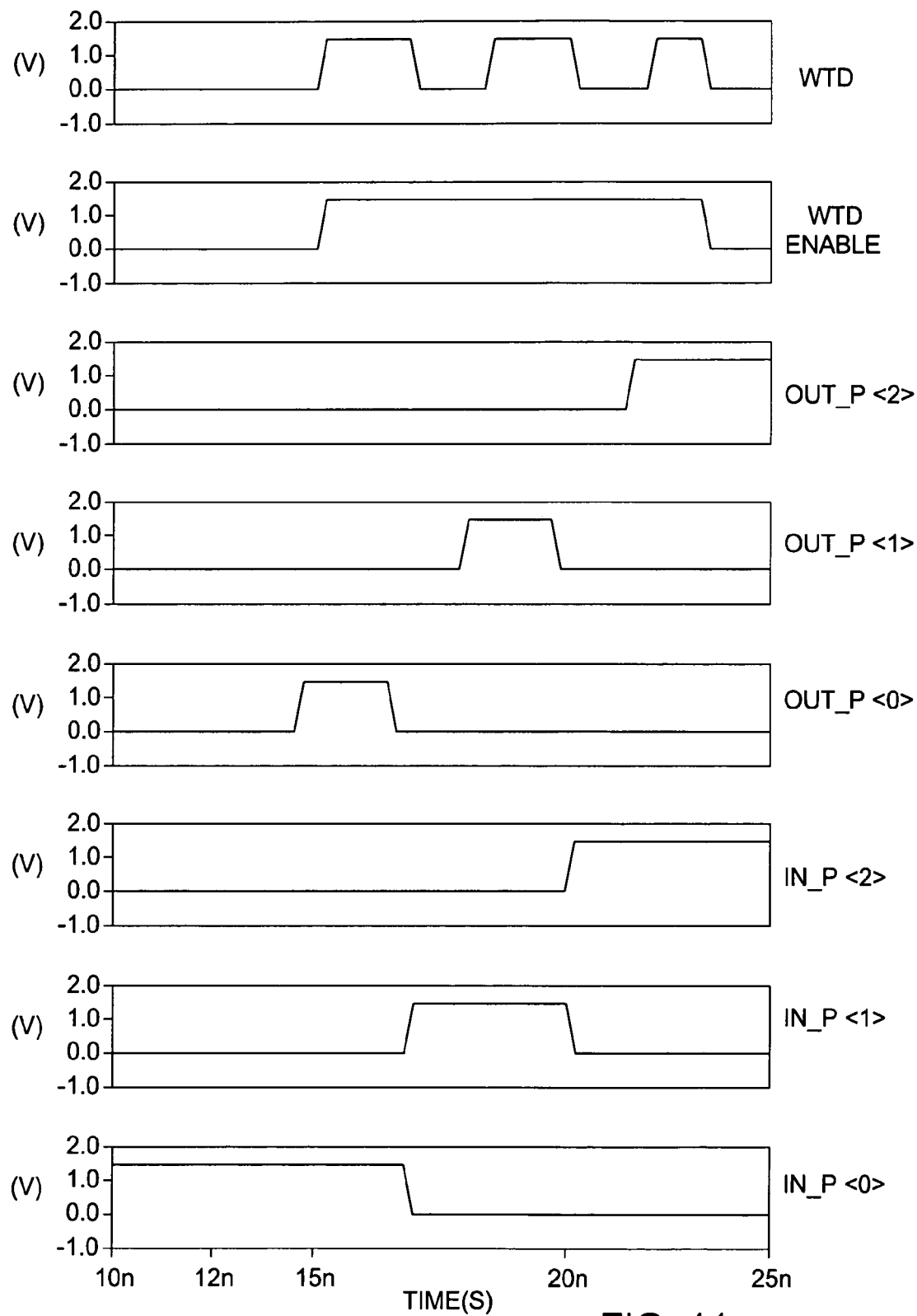
FIG. 11 is a pointer timing example illustrating pointer signals during a high speed operation of a memory device, according to one embodiment of the invention.

Referring now to FIGS. 10 and 11, pointer timing examples are illustrated. In each figure, The top signal is the WTD signal and the next signal down is the WTD_Enable signal produce by the WTD enable logic 304 of FIG. 3. Further, the bottom three signals correspond to three input pointers (IN_P<1>, IN_P<2>, and IN_P<3>) and the next three signals up correspond to three output pointers (OUT_P<1>, OUT_P<2>, and OUT_P<3>).

Referring first to FIG. 10, an illustration of pointer timing corresponding to the relatively slow clock speed of FIG. 5 is illustrated. A pointer signal being pulled high indicates that pointer is active. For example, at 20 ns IN_P<0> is high indicating that the corresponding location in the FIFO structure is being pointed to as the location to which data is about to be written. A few nanoseconds later, IN_P<0> goes low indicating data was written to that location. The input pointer then moves to the next location as indicated by IN_P<1> going high. The movement of the output pointers is similarly represented by changes in the signal OUT_P<0 . . . >. Referring by way of example to IN_P<1>, this input pointer signal goes low (in response to data having been latched in) and a short time later the output pointer signal OUT_P<1> for the same location goes high indicating data is to be shifted out of this location. Thus, at no time do the pointers overlap, i.e., point to the same location. Consequently, the WTD signal stays low.

In contrast, FIG. 11 illustrates situations in which the input pointer and the output pointer point to the same location in the FIFO. For example, it can be seen that while IN_P<1> is high, OUT_P<1> goes high. Evaluation of the input pointer and the output pointer will identify a match causing the WTD signal to go high and get data from the secondary sense amplifiers 170. Note that prior to the WTD_Enable signal the WTD does not go high even when the pointers point to the same location, such as at t=12 ns where IN_P<0> and OUT_P<0> are both high (i.e., point to the same location).

CONCLUSION

Accordingly, embodiments have been described for dynamically setting a secondary sense amplifier by, e.g., adjusting a set signal timing. In application, the embodiments allow a late set signal timing to be used as the default timing. Faster timing can be provided when certain conditions are satisfied.

While the foregoing is directed to embodiments of the present invention, other and further embodiments of the invention may be devised without departing from the basic scope thereof, and the scope thereof is determined by the claims that follow.

What is claimed is:

1. A method for driving data to an output circuit of a memory device, comprising:
   for data read from a memory array of the memory device:
      operating a secondary sense amplifier at a first timing to drive the data to the output circuit; and
      upon detecting a predefined condition, operating the secondary sense amplifier at a second timing to drive the data to the output circuit, the second timing being faster than the first timing relative to the occurrence of a predefined signal.

2. The method of claim 1, wherein the predefined signal is a READ command corresponding to a read access operation for reading the data from the memory array; and wherein operating at the first timing comprises setting the secondary sense amplifier in response to detecting a late set timing signal after the expiration of a predefined delay initiated from the READ command.

3. The method of claim 1, wherein detecting the predefined condition comprises determining that a data storage location in the output circuit from which data is to be output at a next clock edge is the same data storage location into which data is to be input at a next clock edge.

4. The method of claim 1, wherein the output circuit is a FIFO structure and wherein detecting the predefined condition comprises determining that an input pointer and an output pointer are pointing to the same data storage location in the FIFO structure.

5. The method of claim 4, wherein the predefined signal is a READ command corresponding to a read access operation for reading the data from the memory array; and wherein detecting the predefined condition further comprises detecting an early set timing signal after the expiration of a first predefined delay initiated from the READ command.

6. The method of claim 5, wherein the predefined signal is a READ command corresponding to a read access operation for reading the data from the memory array; and wherein operating at the first timing comprises setting the secondary sense amplifier in response to detecting a late set timing signal after the expiration of a second predefined delay initiated from the READ command, the second predefined delay being longer than the first predefined delay.

7. The method of claim 1, further comprising:
   providing a primary sense amplifier coupled to the memory array via a bit line; and driving, by the primary sense amplifier, the data to the secondary sense amplifier via a sense line.

8. A method for driving data to an output circuit of a memory device, comprising:
  operating a secondary sense amplifier at a first timing to drive data to the output circuit, the secondary sense amplifier being coupled to a primary sense amplifier configured to drive the data from a memory array to the secondary sense amplifier;
  determining whether data to be clocked out of the output circuit at a predetermined time will be present in the output circuit at the predetermined time; and
  if the data will not be present at the predetermined time, operating the secondary sense amplifier at a second timing, faster than the first timing, to cause the data to be driven to the output circuit in sufficient time for the data to be clocked out of the output circuit at the predetermined time.

9. The method of claim 8, wherein operating at the first timing comprises setting the secondary sense amplifier in response to detecting a late set timing signal after the expiration of a predefined delay initiated from a READ command corresponding to a read access operation for reading data from a memory array.

10. The method of claim 8, wherein operating at the second timing comprises setting the secondary sense amplifier in response to detecting a combination of an Early Set timing signal and a data request signal; wherein the Early Set timing signal occurs after the expiration of a predefined delay initiated from a READ command corresponding to a read access operation for reading data from a memory array, and the data request signal occurs when location identification logic is simultaneously identifying the same data storage location in the output circuit for data to be input into and output from.

11. The method of claim 8, wherein the determining comprises determining whether a data location in the output circuit to which incoming data from the secondary sense amplifier is to be input at a next clock edge is the same data location in the output circuit to which outgoing data is to be output from at next clock edge.

12. The method of claim 8, wherein the predetermined time accounts for an off-chip driver delay reflective of an amount time required for the data to propagate from an input stage of the output circuit to an output stage of the output circuit.

13. The method of claim 8, wherein the output circuit is a first-in-first-out (FIFO) structure and wherein the determining comprises testing for a match between a location in the FIFO structure being pointed to by an input pointer and a location in the FIFO structure being pointed to by an output pointer.

14. A memory device, comprising:
  one or more memory arrays;
  external data pads;
  for each external data pad, a first-in first-out (FIFO) structure having an input stage configured to transfer a plurality of bits of data in parallel from the memory arrays to a storage location identified by an input pointer having a corresponding input pointer signal and an output stage configured to transfer bits of data sequentially from a storage location identified by an output pointer having a corresponding output pointer signal, wherein the input pointer and the output pointer are shifted periodically from one data storage location to another by adjusting the respective pointer signals; and
  a secondary sense amplifier configured to drive data to the FIFO structure, the data driven from the secondary sense amplifier then being latched into the storage location being pointed to by the input pointer; wherein the secondary sense amplifier can be set to drive data on the basis of at least two different timings relative to the occurrence of a predefined signal.

15. The device of claim 14, wherein the input pointer signal comprises a multi-bit signal adjusted in conjunction with a FIFO_LOAD signal indicating new data from the memory arrays is available for transfer to the FIFO structure.

16. The device of claim 14, further comprising pointer compare logic configured to evaluate the input pointer and output pointer and assert a data request signal when the input pointer and output pointer are determined to be pointing to the same data storage location.

17. The device of claim 14, wherein the predefined signal is a READ command corresponding to a read access operation for reading the data from the memory arrays; and wherein each of the at least two different timings are defined on the basis of timing signals asserted at respective predefined periods of time after the READ command.

18. The device of claim 14, wherein the predefined signal is a READ command corresponding to a read access operation for reading the data from the memory arrays; and further comprising timing logic configured to assert at least two different timing signals each corresponding to one of the at least two different timings; and wherein the timing logic is configured to assert the timing signals at respective predefined periods of time after the READ command.

19. The device of claim 14, wherein one of the at least two different timing signals is an early set signal which, in combination with a data request signal asserted upon detecting the input pointer and output pointer pointing the same storage location, causes the secondary sense amplifier to be set.

20. A memory device, comprising:
  one or more memory arrays;
  external data pads;
  for each external data pad, a first-in first-out (FIFO) structure having a plurality of entries for storing data from the one or more memory arrays;
  pointer generation logic configured to generate: (i) an input pointer signal defining an input pointer to identify a particular entry in the FIFO structure in which to store data from the one or more memory arrays; and (ii) an output pointer signal defining an output pointer to identify a particular entry in the FIFO structure from which to shift data out of; wherein the pointer generation logic is configured to shift the input pointer and the output pointer periodically from one entry to another by adjusting the respective pointer signals;
  a data request signal generator configured to assert a data request signal upon detecting the input pointer and output pointer are pointing to the same entry of the FIFO structure;
  a secondary sense amplifier configured to drive data to the FIFO structure, the data driven from the secondary sense amplifier then being latched into the storage location being pointed to by the input pointer; wherein the secondary sense amplifier can be set to drive data on the basis of at least a first timing that is dependent on the data request signal and a second timing that is independent of the data request signal.

21. The device of claim 20, further comprising timing generation logic configured to assert at least a first timing signal corresponding to the first timing and a second timing signal corresponding to the second timing; and wherein the timing logic is configured to assert the timing signals at respective predefined periods of time after a READ command corresponding to a read access operation for reading the data from the memory arrays.

22. A memory device, comprising:
one or more memory arrays;
a first-in first-out (FIFO) structure having a plurality of entries for storing data from the one or more memory arrays;
location identification logic configured to identify entries in the FIFO for shifting data into and out of;
a data request signal generator configured to assert a data request signal upon detecting that the location identification logic is simultaneously identifying the same entry for data to be input into and output from; and
a secondary sense amplifier configured to drive data to the FIFO structure, the data driven from the secondary sense amplifier then being latched into an entry identified by the location identification logic; wherein the secondary sense amplifier can be set to drive data on the basis of at least a first timing that is dependent on the data request signal and a second timing that is independent of the data request signal.

23. The device of claim 22, further comprising timing generation logic configured to assert at least a first timing signal corresponding to the first timing and a second timing signal corresponding to the second timing; and wherein the timing logic is configured to assert the timing signals at respective predefined periods of time after a READ command corresponding to a read access operation for reading the data from the memory arrays.

24. A memory device, comprising:
data storage means;
buffer means having a plurality of entries for storing data from the data storage means;
location identification means configured to identify entries in the buffer means for shifting data into and out of;
data request means for asserting a data request signal upon detecting that the location identification means is simultaneously identifying the same entry for data to be input into and output from; and
amplification means configured to drive data to the buffer means, the data driven from the amplification means then being latched into an entry identified by the location identification means; wherein the amplification means can be set to drive data on the basis of at least a first timing that is dependent on the data request signal and a second timing that is independent of the data request signal.

25. The memory device of claim 24, further comprising primary amplification means configured to drive data from the data storage means to the amplification means via sense lines.

26. The memory device of claim 24, further comprising timing means configured to assert at least a first timing signal corresponding to the first timing and a second timing signal corresponding to the second timing; and wherein the timing means is configured to assert the timing signals at respective predefined periods of time after a READ command corresponding to a read access operation for reading the data from the data storage means.

* * * * *